US009575093B2

(12) United States Patent
Beyeler et al.

(10) Patent No.: US 9,575,093 B2
(45) Date of Patent: Feb. 21, 2017

(54) SYSTEM FOR THE COMBINED, PROBE-BASED MECHANICAL AND ELECTRICAL TESTING OF MEMS

(71) Applicant: FEMTOTOOLS AG, Buchs (CH)

(72) Inventors: Felix Beyeler, Regensdorf (CH); Christoph Bolliger, Birsfelden (CH); Daniel Frost, Zurich (CH); David Beyeler, Daellikon (CH); Simon Muntwyler, Zurich (CH)

(73) Assignee: Femtotools AG, Buchs (CH)

( * ) Notice: Subject to any disclaimer, the term of this patent is extended or adjusted under 35 U.S.C. 154(b) by 44 days.

(21) Appl. No.: 14/516,793

(22) Filed: Oct. 17, 2014

(65) Prior Publication Data

US 2015/0204904 A1 Jul. 23, 2015

(30) Foreign Application Priority Data

Jan. 17, 2014 (EP) .................................... 14151631

(51) Int. Cl.
*G01R 31/20* (2006.01)
*G01R 1/04* (2006.01)
(Continued)

(52) U.S. Cl.
CPC ........... *G01R 1/0408* (2013.01); *B81C 99/005* (2013.01); *G01D 5/12* (2013.01); *G01L 1/18* (2013.01);
(Continued)

(58) Field of Classification Search
CPC ... G01R 1/0408; G01R 1/44; G01R 31/31702; G01R 31/00; B81B 2207/03; B81B 2201/11; G11B 5/127; B81C 99/003; B81C 99/0035; B81C 99/005; G01D 5/12; G01D 5/125; G01L 1/18; G01L 3/02
(Continued)

(56) References Cited

U.S. PATENT DOCUMENTS 6,088,474 A * 7/2000 Dudasko ............... B81C 99/004
382/145
6,341,259 B1 * 1/2002 Gutierrez ................ G01P 21/00
367/140
(Continued)

FOREIGN PATENT DOCUMENTS

WO WO 2006135939 A2 * 12/2006 ........... B81C 99/003

OTHER PUBLICATIONS

Honeywell, Model 6443: X-Y Force sensor Datasheet, Honeywell International, Inc., Copyright 2008.*
(Continued)

*Primary Examiner* — Jermele M Hollington
*Assistant Examiner* — Sean Curtis
(74) *Attorney, Agent, or Firm* — Laurence A. Greenberg; Werner H. Stemer; Ralph E. Locher

(57) ABSTRACT

A system for testing MEMS-structures includes a microforce sensor, two or more multi-axis micropositioning units, at least one electrical probe and a sample holder on which a MEMS-structure is mounted. At least one of the multi-axis micropositioning units is motorized and at least one additional micropositioning unit is equipped with at least one electrical probe to apply electrical signals or to measure electrical signals at one or multiple locations on the MEMS structure. The system with the aforementioned components allows a combined electrical and probe-based mechanical testing of MEMS-structures.

22 Claims, 3 Drawing Sheets

(51) Int. Cl.
*B81C 99/00* (2010.01)
*G01D 5/12* (2006.01)
*G01L 1/18* (2006.01)
*G01L 3/02* (2006.01)
*G01R 1/44* (2006.01)
*G01R 31/00* (2006.01)

(52) U.S. Cl.
CPC . *G01L 3/02* (2013.01); *G01R 1/44* (2013.01); *G01R 31/00* (2013.01)

(58) Field of Classification Search
USPC ............... 324/71.5, 750.16, 750.25, 754.01, 324/754.03, 754.07, 754.12–754.13, 758, 324/762.01–762.09
See application file for complete search history.

(56) References Cited

U.S. PATENT DOCUMENTS

| | | | | |
|---|---|---|---|---|
| 6,590,212 B1* | 7/2003 | Joseph | ................... | B81C 99/005 250/306 |
| 6,674,077 B1* | 1/2004 | Joseph | ................... | B81C 99/005 250/306 |
| 6,708,132 B1* | 3/2004 | Gutierrez | .............. | B81C 99/005 324/243 |
| 7,055,378 B2* | 6/2006 | Su | ........................... | B82Y 35/00 73/105 |
| 7,088,121 B1* | 8/2006 | Arora | ................. | G01R 31/2853 324/719 |
| 7,107,694 B2* | 9/2006 | Yang | ...................... | B82Y 35/00 33/18.1 |
| 7,304,486 B2* | 12/2007 | Petersen | ................. | G01R 1/073 324/750.16 |
| 7,436,194 B2* | 10/2008 | Gleason | ............. | G01R 1/06711 324/754.03 |
| 7,444,880 B2* | 11/2008 | Zhang | ................... | B81C 99/005 73/779 |
| 8,266,969 B2* | 9/2012 | Abramson | ........... | G01R 31/319 73/788 |
| 8,281,648 B2* | 10/2012 | Leroux | .................... | G01N 3/42 73/81 |
| 8,310,128 B2* | 11/2012 | Ferreira | ................. | H02N 1/008 310/309 |
| 8,448,501 B2* | 5/2013 | Proksch | ................. | G01Q 60/24 73/105 |
| 8,499,645 B2* | 8/2013 | Chasiotis | ............... | G01N 19/04 73/789 |
| 8,770,036 B2* | 7/2014 | Vodnick | ............... | G01B 21/047 73/788 |
| 8,939,041 B2* | 1/2015 | Vodnick | ............... | G01B 21/047 33/1 BB |
| 9,034,666 B2* | 5/2015 | Vaganov | ................. | G01L 5/162 324/750.01 |
| 9,157,845 B2* | 10/2015 | Oh | ......................... | B82Y 35/00 |
| 9,194,885 B2* | 11/2015 | Kanev | ............... | G01R 31/2868 |
| 9,304,072 B2* | 4/2016 | Oh | ............................ | G01N 3/42 |
| 2007/0045537 A1* | 3/2007 | Joseph | .................. | B81C 99/003 250/310 |
| 2013/0098145 A1* | 4/2013 | Oh | ........................... | G01N 3/42 73/81 |
| 2015/0204904 A1* | 7/2015 | Beyeler | .................... | G01D 5/12 324/750.25 |

OTHER PUBLICATIONS

NanoScience, Micromechanical Testing Systems, Nanoscience Instruments, Copyright 2016.*
Lot-Qt: "FT-RS5000 Microrobotic Station", Nov. 21, 2013 (Nov. 21, 2013), XP055310355, Retrieved from the Internet: URL:http://183.169.23.21/files/downloads/femtotools/eu/standalone-systems/FT-RS5000_Microrobotic_Station_eu_pdf [retrieved on Oct. 13, 2016].
Anonymous: "FemtoTools: FT-RS5000 Microrobotic Station", Jan. 29, 2013 (Jan. 29, 2013), XP055310368, Retrieved from the Internet: URL:http://web.archive.org/web/20130129012526/http://www.femtotools.com/index.php?id=products-rs5000 [retrieved on Oct. 13, 2016].
Anonymous: "Computer Aided Probing- Signatone", Jun. 27, 2009 (Jun. 27, 2009), XP055310469, Retrieved from the Internet: URL:https://web.archive.org/web/20090627104640 1http:// www.signatone.com/products/micropositioners/comput_aid.asp [retrieved on Oct. 13, 2016].

* cited by examiner

SYSTEM FOR THE COMBINED, PROBE-BASED MECHANICAL AND ELECTRICAL TESTING OF MEMS

CROSS-REFERENCE TO RELATED APPLICATION

This application claims the priority, under 35 U.S.C. §119, of European Patent Application EP 14 151 631.0, filed Jan. 17, 2014; the prior application is herewith incorporated by reference in its entirety.

BACKGROUND OF THE INVENTION

Field of the Invention

The present invention relates to a probe-based system for the combined mechanical and electrical testing of a MEMS structure, including a microforce sensor, at least two multi-axis micropositioning units, at least one microscope, at least one electrical probe, a data acquisition unit and a sample holder on which the MEMS structure to be tested is mounted.

Micro-electromechanical systems (MEMS) by definition include a mechanical structure. The mechanical properties such as:
  stiffness,
  deflection range,
  linearity,
  creep,
  yield strength,
  actuation forces,
  friction forces and
  hysteresis
are of great importance for the proper functionality of the MEMS device. However, measuring those mechanical properties is a great challenge due to the small size of the structures on a MEMS chip as well as the small forces and deformations that occur during operation. Additionally, conventional MEMS testing systems typically cannot offer a combined measurement of both the mechanical properties and electrical signals that are applied or generated by the MEMS device. Combined electrical and mechanical testing of MEMS devices is of great importance in microsystems research and development as well as quality control during MEMS fabrication. That is especially the case for MEMS sensors which create an electrical signal in relation to mechanical load (e.g. accelerometers, gyroscopes, tilt sensors, pressure sensors, self-sensing cantilevers). That signal is called an output signal. MEMS actuators (e.g. micro mirrors, resonators, switches) also create a mechanical output when electrical driving signals are applied. In the case of the MEMS actuators, mechanical characteristics such as stiffness, deflection and actuator force need to be measured in relation to electrical signals. To summarize, the following electrical signals can be important during the mechanical test:
  Driving voltage applied to the MEMS structure
  Driving current applied to the MEMS structure
  Resistance change of the MEMS structure
  Capacitance change of the MEMS structure
  Voltage change generated by the MEMS structure
  Electrical charge generated by the MEMS structure.

The combined mechanical and electrical testing allows for the validation of mathematical models during the design phase of novel MEMS devices, the measurement of the material properties used for the fabrication of the MEMS devices and for quality control during the volume fabrication of MEMS devices prior to packaging. Therefore, the mechanical-electrical characterization enables a reduction of the development time and costs and a reduction of MEMS chip fabrication due to the early detection of defective wafers and chips.

DESCRIPTION OF THE RELATED ART

Mechanical MEMS testing is currently performed by optical methods (laser Doppler vibrometer) and probe-based methods (atomic force microscopes and nanoindentors). Optical testing is the most frequently used method nowadays. The advantage of that technology is the fast, non-contact deflection measurement over a large frequency range. The disadvantage is that only deflections of the MEMS structures can be measured. Direct measurement of stiffness, force, linearity, hysteresis, yield strength, etc. is not possible and is usually calculated based on mathematical models. Another limitation is that curved, reflective surfaces cause problems when the light is not reflected back to the photo-sensor resulting in measurement errors. Atomic force microscopes and nanoindentors are systems that are provided by a large number of companies. Their hardware and software has been optimized for other applications than MEMS testing (e.g. surface profile measurement, indentation). The systems are also normally limited to vertical measurements only and cannot be used for in-plane deflection/force measurement. Due to those limitations, the market share in the MEMS testing market is much lower than for optical systems.

Another group of probe-based testing instruments are the surface profilers. Those systems are frequently used for topography measurements on wafers, but cannot extract the mechanical properties of the sample to be tested.

Several probe-based MEMS testing systems can be found in the literature, such as in [1] to [9]. However, none of those systems combine probe-based mechanical testing and electrical testing. Additionally, those systems are limited to horizontal or vertical testing. The documents do not list the use of micropositioning devices for electrical probing during the mechanical test. The usage of a conductive tip is mentioned in [1]. However, that allows electrical probing using the microforce sensor only rather than with one or multiple additional electrical probes. Also, a visual observation of the MEMS structure under test is not possible in most cases since the sensor probe is blocking the view during the measurement.

SUMMARY OF THE INVENTION

It is accordingly an object of the invention to provide a system for the combined, probe-based mechanical and electrical testing of MEMS, which overcomes the hereinafore-mentioned disadvantages and drawbacks of the heretofore-known systems of this general type.

With the foregoing and other objects in view there is provided, in accordance with the invention, a probe-based system for the combined mechanical and electrical testing of a MEMS structure, the system comprising at least one motorized multi-axis micropositioning unit having position encoders generating signals, and at least one additional micropositioning unit, a microforce sensor mounted on the at least one motorized multi-axis micropositioning unit and configured to probe the MEMS structure and generate an output signal, at least one electrical probe mounted on the at least one additional micropositioning unit and configured to apply electrical signals or to measure electrical signals at one or multiple locations on the MEMS structure and to generate signals, at least one microscope being tilted for visualization of a perspective view or a side view of the MEMS structure, a data acquisition unit configured to record the output signal generated by the microforce sensor, the signals generated by the position encoders and the signals generated by the electrical probes, and a sample holder on which the MEMS structure to be tested is mounted.

The system for the combined testing of MEMS structures described herein uses a probe-based approach. It is differentiated from the other technologies by combining the following properties:

on chip/wafer testing of MEMS structures with simultaneous observation of the structure and sensor probe tip (precise structure-probe alignment);
direct and Si-traceable, vertical and horizontal mechanical testing (not a mathematical model based approach);
measurements on structured and non-flat chips/wafers;
combined electrical and mechanical measurements.

Other features which are considered as characteristic for the invention are set forth in the appended claims.

Although the invention is illustrated and described herein as embodied in a system for the combined, probe-based mechanical and electrical testing of MEMS, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
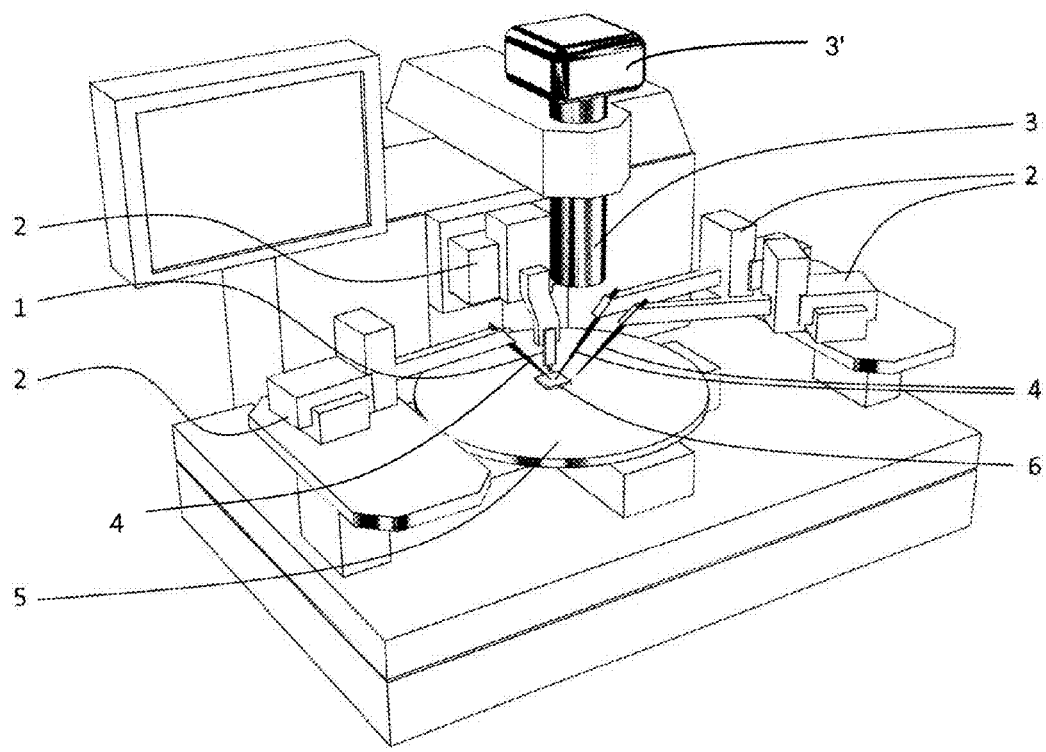
FIG. 1 is a diagrammatic, perspective view of a MEMS testing system.
Figure 2:
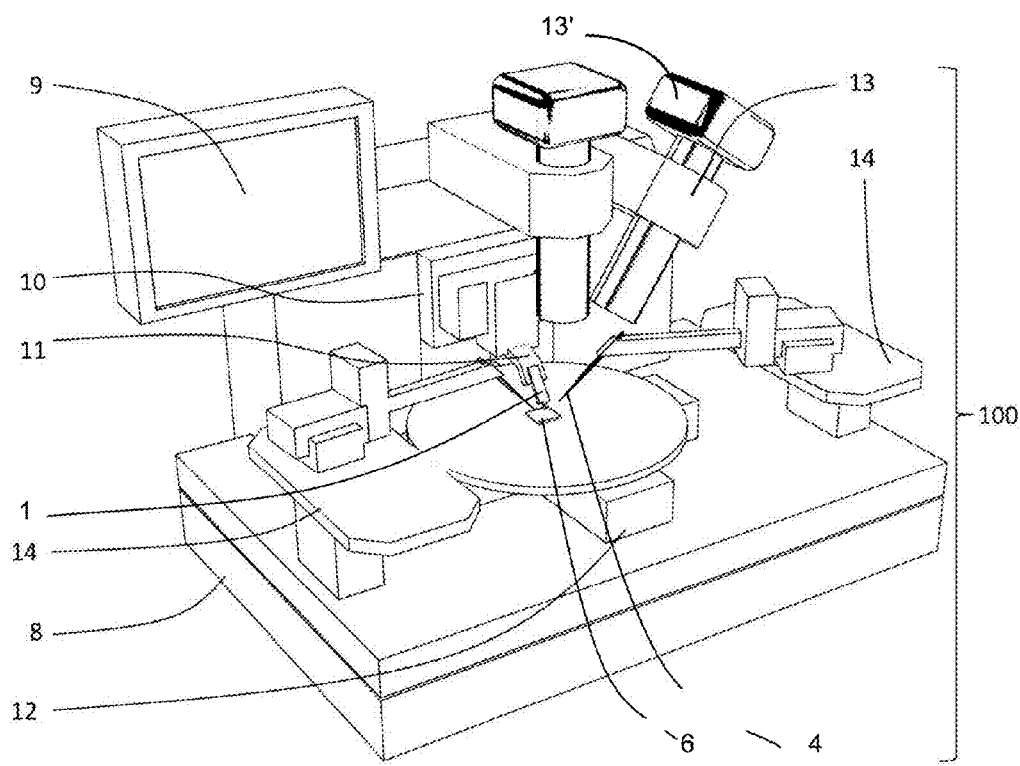
FIG. 2 is a perspective view of a MEMS testing system with an additional, tilted microscope configuration and a rotated microforce sensor.
Figure 3:
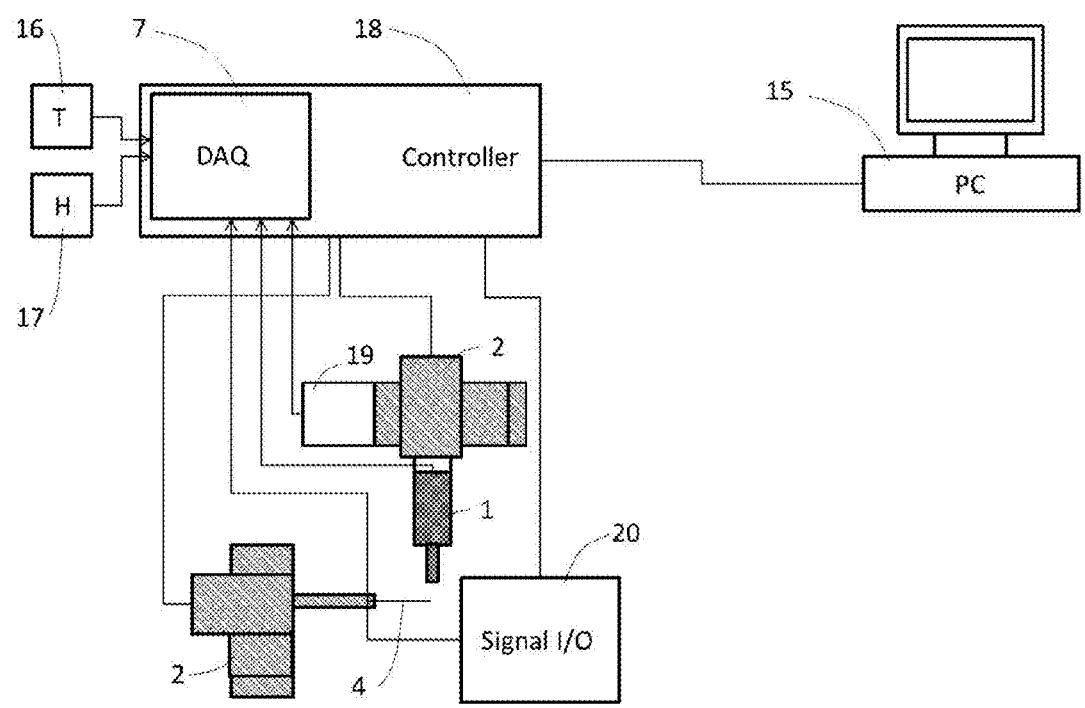
FIG. 3 is a block diagram of a MEMS testing system.

System Construction:
Referring now in detail to FIGS. 1-3 of the drawings, which show the working principle of the invention, there is seen a MEMS testing system constructed for the combined micromechanical and electrical testing of MEMS structures 6. The term "MEMS structure" means a part of a MEMS chip, a complete MEMS chip or multiple MEMS chips on a wafer. This MEMS testing system is a probe-based measurement system, which means that mechanical probes (a tip of a microforce sensor 1) and electrical probes 4 are brought in contact with the MEMS structure 6 to be tested during the measurement. An operator controls a probe-based measurement system 100 by using a computer 15.

Positioning of Probes:
The probe-based measurement system 100, which is illustrated in FIG. 1, includes at least two micropositioning units 2. One of these micropositioning units 2 is a motorized, piezoelectric actuator with integrated position encoders 19 on which the microforce sensor 1 is mounted by an adapter piece or directly. A rotatable adapter piece 11 may be used to allow for changing the orientation of the microforce sensor 1 from vertical to horizontal or any other angle. This is especially useful for testing MEMS structures 6 on which mechanical properties need to be measured in the vertical and horizontal directions. A rotation axis of the rotatable adapter piece 11 is chosen in such a way that it goes through the tip of the microforce sensor 1 to make sure that the tip of the microforce sensor 1 stays within the view of a microscope 3. Another possibility to resolve both vertical and horizontal force components is the usage of a multi-axis microforce sensor. Due to the force range typically ranging from nano-newtons to newtons, the limitations in space and the small size of most MEMS structures 6, a microforce sensor 1 based on capacitive MEMS sensing technology or piezoelectric MEMS sensing technology is used. However, optical MEMS sensors or non-MEMS microforce sensors may be implemented also.

The piezoelectric actuation allows for the very high-resolution application of force to the MEMS structure 6 to be tested while measuring the position of the microforce sensor 1 by using the position encoders 19. This position signal is then used to measure the deformation of the MEMS structure 6 during the test. In order to allow both large range and high resolution positioning using piezoelectric actuation technology, a micropositioning unit 2 which combines stepping-mode (stick-slip mode—coarse) and scanning mode (fine) can be used.

One or more additional micropositioning units 2 are equipped with electrical probes 4 for electrical probing such as measurement of electrical signals or the application of electrical signals as shown in FIG. 1 and FIG. 2. These micropositioning units 2 may be placed on a table 14 that can be moved in the vertical direction. Similar to a probe-station, this allows the fast contacting of multiple locations on similar MEMS structures 6 on a wafer. The micropositioning units or stages 2 on which electrical probes 4 are mounted do not necessarily need to be motorized and do not necessarily require integrated encoders 19 for position measurement.

Visualization:
Prior to the measurement, the MEMS structure is mounted on a sample holder 5 which is typically a wafer chuck or a chip holder. This reversible attachment is realized by vacuum or a mechanical fixture. At least one microscope 3 is used for the visualization of the MEMS structure 6. The visualization is required for the alignment of the microforce sensor 1 and the electrical probes 4 relative to the MEMS structure 6. Since the microforce sensor 1 and the electrical probes 4 may block parts of the view, one or more additional microscopes may be used that allow for the visualization of the MEMS structure 6 under a different angle as shown in FIG. 2. In order to increase the depth of field of the tilted microscope 13 and to correct for perspective distortions, a Scheimpflug configuration may be used.

The microscopes 3 are equipped with digital cameras 3' (e.g. CMOS, CCD) to record vision data during the combined electrical and mechanical test. Illumination is realized with a through-the-lens illumination system. This gives the best images for reflective surfaces which are typical for MEMS structures 6 such as chips and wafers. Additionally, a diffuse light source (not depicted in FIGS. 1 and 2) can be used to reflect and scatter light into one of the microscopes 3 when monitoring the MEMS structure 6. This diffuse light source can also be used to reflect light into the tilted cameras 13' for which a through-the-lens illumination is not suitable. The tilted cameras 13' can be attached to a tilted microscope 13. The diffuse light can be seen as a background diffuser light source (not depicted in FIGS. 1 and 2). A long-range positioning stage 12 is used in order to bring the MEMS structure 6 into the field of view of the microscopes 3. Typically, this long-range positioning stage has three degrees of freedom: two-axis movement in the horizontal plane and rotation with the rotation axis being vertical. Additionally, a motorized long-range positioning stage 12 enables an automated electromechanical measurement on a large number of MEMS chips on a wafer.

Measurement:

Reference is made to FIG. 3 showing a diagram of a MEMS testing system. During the measurement, the tip of the microforce sensor 1 is pushed against the MEMS structure 6 in the direction that is of interest for the measurement of the mechanical properties. A multi-channel data acquisition unit 7 is recording the output signal of the microforce sensor 1, the position signal of the encoders 19 by the micropositioning unit 2 on which the microforce sensor 1 is mounted and the electrical signals by the electrical probes 4 that have been brought into contact on one or multiple locations on the MEMS structure 6. A complete electromechanical characterization of the MEMS structure 6 is realized with that data. The electrical probes 4 may also be used to apply an electrical signal to the MEMS structure 6 instead of a passive measurement. This measurement mode is, for example, used when measuring the actuation force of a MEMS structure (in that case a MEMS actuator). A signal I/O 20, which includes a signal generator, is integrated in the system for that purpose. The signal I/O 20 also features connectors to enable the interfacing of the electrical signals with external electrical characterization tools or an external frequency generator.

Increasing Measurement Quality and Protection of Sensitive Parts:

As an additional feature a screen 9 (see FIG. 1 and FIG. 2) may be integrated into the system 100 to show the microscope camera image, the measurement data or the status of the system. Temperature sensors and humidity sensors may be integrated to monitor environmental conditions during the measurement, since it is required that the MEMS structure 6 has to be tested at a specified temperature. In order to compensate for thermal expansion in the vertical direction, a material with a corresponding thermal expansion coefficient that is compensating for the expansion may be integrated underneath the sample holder 5 or in the mechanical structure of the system. Mechanical vibrations due to the environment can be reduced or eliminated by using an active or passive vibration insulation system 8 on which the probe-based system 100 is placed. Without the vibration insulation system 8, the signal of the microforce sensor 1 will have a lower quality. A protective cover (not shown in FIGS. 1 and 2) is used to reduce the air flow during the measurement. This is important since the air flow may induce error into the mechanical measurement. The cover protects both the MEMS structure 6 and the microforce sensor 1.

In order to protect the sensitive microforce sensor 1 against mechanical damage or contamination with dust, the following features are realized: The micropositioning unit on which the microforce sensor 1 is mounted can be retracted into a safe position by a retractable micropositioning unit holder 10. In order to avoid overloading the sensitive microforce sensor 1 or the MEMS structure 6 during the measurement or probe alignment, the micropositioning units 2 are automatically stopped by a controller 18 when a critical force level is reached. This is possible, since the output signal of the mircoforce sensor (1) is constantly monitored by the data acquisition unit (7), and the data acquisition unit is a part of the controller 18.

LIST OF CITED DOCUMENTS

[1] European Patent Application EP 24 80 925 A1 entitled "System for mechanical characterization of materials and biological samples in the sub-millinewton force range"

[2] U.S. Pat. No. 5,866,807 A entitled "Method and apparatus for measuring mechanical properties on a small scale"

[3] U.S. Pat. No. 7,055,378 B2 entitled "System for wide frequency dynamic nanomechanical analysis"

[4] International Publication No. WO 2012/109577 A2 entitled "Nanomechanical testing system"

[5] U.S. Patent No. 20100088788 A1 entitled "Stress micro mechanical test cell, device, system and methods"

[6] U.S. Patent Application Publication No. 2007/0148792 A1 entitled "Wafer measurement system and apparatus"

[7] U.S. Pat. No. 8,161,803 B2 entitled "Micromachined comb drive for quantitative nanoindentation"

[8] U.S. Patent Application Publication No. 2006/0196280 A1 entitled "Active sensor for micro force measurement"

[9] "Monolithically Integrated Two-Axis Microtensile Tester for the Mechanical Characterization of Microscopic Samples", IEEE/ASME Journal of Microelectromechanical Systems (JMEMS), Vol. 19, No. 5, October 2010, pp. 1223-1233; http://www.iris.ethz.ch/msrl/publications/files/JMEMS_Simon_2010.pdf.

The invention claimed is:

1. A probe-based system for the combined mechanical and electrical testing of a MEMS structure, the system comprising:
   at least one motorized multi-axis micropositioning unit having position encoders generating signals, and at least one additional micropositioning unit;
   a microforce sensor mounted on said at least one motorized multi-axis micropositioning unit and configured to probe the MEMS structure and generate an output signal;
   a rotatable adapter piece mounting said microforce sensor on said at least one motorized multi-axis micropositioning system and permitting said microforce sensor to change between vertical testing and horizontal mechanical testing or testing at any other angle;
   at least one electrical probe mounted on said at least one additional micropositioning unit and configured to apply electrical signals or to measure electrical signals at one or multiple locations on the MEMS structure and to generate signals;
   at least one microscope being tilted for visualization of a perspective view or a side view of the MEMS structure;
   a data acquisition unit configured to record the output signal generated by said microforce sensor, the signals generated by said position encoders and the signals generated by said at least one electrical probe; and
   a sample holder on which the MEMS structure to be tested is mounted.

2. The probe-based system according to claim 1, wherein said microforce sensor is a capacitive MEMS sensor or a piezoresistive MEMS sensor.

3. The probe-based system according to claim 1, wherein said microforce sensor is a multi-axis MEMS sensor configured to resolve force components in different directions in space.

4. The probe-based system according to claim 1, which further comprises a long-range positioning stage on which said sample holder is mounted for testing multiple locations on a MEMS chip or a whole wafer.

5. The probe-based system according to claim 1, which further comprises:
a controller configured to control said micropositioning units;
said data acquisition unit configured to constantly monitor the output signal of said microforce sensor and to cause said controller to send a stop-signal to said micropositioning units if a critical force level is reached to avoid overloading said microforce sensor.

6. The probe-based system according to claim 1, wherein said at least one microscope includes a plurality of microscopes, and a diffuse light source is configured to reflect and scatter light into one of said microscopes when monitoring the MEMS structure.

7. The probe-based system according to claim 1, which further comprises a screen configured to display one or more microscope camera images or to view measurement data or a status of the system.

8. A probe-based system for the combined mechanical and electrical testing of a MEMS structure, the system comprising:
at least one motorized multi-axis micropositioning unit having position encoders generating signals, and at least one additional micropositioning unit;
a microforce sensor mounted on said at least one motorized multi-axis micropositioning unit and configured to probe the MEMS structure and generate an output signal;
a retractable micropositioning unit holder configured to retract said microforce sensor into a safe position to protect said microforce sensor against contamination by dust and mechanical damage;
at least one electrical probe mounted on said at least one additional micropositioning unit and configured to apply electrical signals or to measure electrical signals at one or multiple locations on the MEMS structure and to generate signals;
at least one microscope being tilted for visualization of a perspective view or a side view of the MEMS structure;
a data acquisition unit configured to record the output signal generated by said microforce sensor, the signals generated by said position encoders and the signals generated by said at least one electrical probe; and
a sample holder on which the MEMS structure to be tested is mounted.

9. The probe-based system according to claim 1, which further comprises a movable table on which at least one of said multi-axis micropositioning units is fixed, said movable table being movable in a vertical direction to bring said at least one electrical probe in contact with the MEMS structure.

10. The probe-based system according to claim 1, which further comprises a vibration insulation table for insulating the probe-based system against vibration.

11. The probe-based system according to claim 1, which further comprises an enclosure configured to cover said microforce sensor and said sample holder and to be opened for exchanging a MEMS structure.

12. A probe-based system for the combined mechanical and electrical testing of a MEMS structure, the system comprising:
at least one motorized multi-axis micropositioning unit having position encoders generating signals, and at least one additional micropositioning unit;
a microforce sensor mounted on said at least one motorized multi-axis micropositioning unit and configured to probe the MEMS structure and generate an output signal;
at least one electrical probe mounted on said at least one additional micropositioning unit and configured to apply electrical signals or to measure electrical signals at one or multiple locations on the MEMS structure and to generate signals;
at least one microscope being tilted for visualization of a perspective view or a side view of the MEMS structure;
a data acquisition unit configured to record the output signal generated by said microforce sensor, the signals generated by said position encoders and the signals generated by said at least one electrical probe; and
a sample holder on which the MEMS structure to be tested is mounted, said sample holder having a mounting material with a corresponding thermal expansion coefficient for compensating thermal expansion in a vertical direction.

13. The probe-based system according to claim 1, wherein at least one of said micropositioning units is a piezoelectric actuator configured to be operated in a stepping-mode and a scanning-mode.

14. The probe-based system according to claim 1, which further comprises a temperature sensor and a humidity sensor configured to monitor environmental conditions.

15. The probe-based system according to claim 1, wherein said sample holder is configured to be heated or cooled for heating or cooling the MEMS structure in order to carry out tests at a temperature specified for that MEMS structure.

16. The probe-based system according to claim 1, which further comprises a scheimpflug configuration attached to said at least one tilted microscope in order to increase a depth of field of said at least one tilted microscope.

17. The probe-based system according to claim 8, wherein said microforce sensor is a capacitive MEMS sensor or a piezoresistive MEMS sensor.

18. The probe-based system according to claim 8, wherein said microforce sensor is a multi-axis MEMS sensor configured to resolve force components in different directions in space.

19. The probe-based system according to claim 8, which further comprises a long-range positioning stage on which said sample holder is mounted for testing multiple locations on a MEMS chip or a whole wafer.

20. The probe-based system according to claim 12, wherein said microforce sensor is a capacitive MEMS sensor or a piezoresistive MEMS sensor.

21. The probe-based system according to claim 12, wherein said microforce sensor is a multi-axis MEMS sensor configured to resolve force components in different directions in space.

22. The probe-based system according to claim 12, which further comprises a long-range positioning stage on which said sample holder is mounted for testing multiple locations on a MEMS chip or a whole wafer.

* * * * *